(12) United States Patent
Beach

(10) Patent No.: US 6,721,146 B2
(45) Date of Patent: Apr. 13, 2004

(54) MAGNETIC RECORDING GMR READ BACK SENSOR AND METHOD OF MANUFACTURING

(75) Inventor: Robert S. Beach, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 09/809,687

(22) Filed: Mar. 14, 2001

(65) Prior Publication Data

US 2002/0131218 A1 Sep. 19, 2002

(51) Int. Cl.$^7$ ................................................ G11B 5/33
(52) U.S. Cl. ................................................ 360/324.12
(58) Field of Search ..................... 360/324.12

(56) References Cited

U.S. PATENT DOCUMENTS

| 4,663,685 A | 5/1987 | Tsang | 360/113 |
|---|---|---|---|
| 5,461,527 A | 10/1995 | Akiyama et al. | 360/113 |
| 5,465,185 A | 11/1995 | Heim et al. | 360/113 |
| 5,492,720 A | 2/1996 | Gill et al. | 427/131 |
| 5,583,725 A | 12/1996 | Coffey et al. | 360/113 |
| 5,701,223 A | 12/1997 | Fontana, Jr. et al. | 360/113 |
| 5,739,987 A | 4/1998 | Yuan et al. | 360/113 |
| 5,742,459 A | 4/1998 | Shen et al. | 360/113 |
| 5,768,067 A | 6/1998 | Saito et al. | 360/113 |
| 5,910,344 A | 6/1999 | Hasegawa et al. | 427/599 |
| 5,949,623 A | 9/1999 | Lin | 360/113 |
| 5,959,810 A | 9/1999 | Kakihara et al. | 360/113 |
| 5,974,657 A | 11/1999 | Fox et al. | 29/603.08 |
| 5,995,338 A | 11/1999 | Watanabe et al. | 360/113 |
| 6,038,107 A | 3/2000 | Pinarbasi | 360/113 |
| 6,040,961 A | 3/2000 | Gill | 360/113 |
| 6,129,957 A | 10/2000 | Xiao et al. | 427/548 |
| 6,462,919 B1 * | 10/2002 | Mack et al. | 360/324.2 |
| 6,469,878 B1 * | 10/2002 | Mack et al. | 360/324.12 |
| 6,473,279 B2 * | 10/2002 | Smith et al. | 324/252 |

FOREIGN PATENT DOCUMENTS

| JP | 09016923 A | 1/1997 | G11B/5/39 |
|---|---|---|---|
| JP | 10312515 A | 4/1998 | G11B/5/39 |
| JP | 11096519 A | 4/1999 | G11B/5/39 |
| JP | 11-213346 | 8/1999 | G11B/5/39 |
| JP | 11-345409 | 12/1999 | G11B/5/39 |

* cited by examiner

*Primary Examiner*—David L. Ometz
*Assistant Examiner*—Mark Blouin
(74) *Attorney, Agent, or Firm*—Silicon Valley IP Group, PC; Dominic M. Kotab

(57) ABSTRACT

A GMR magnetic sensor is described. The sensor uses one antiferromagnetic layer for stabilizing the pinned layer and another antiferromagnetic layer for providing magnetic bias stabilization of the free layer. Both antiferromagnetic layers are made of the same material and are initialized in the same process step.

6 Claims, 7 Drawing Sheets

MAGNETIC RECORDING GMR READ BACK SENSOR AND METHOD OF MANUFACTURING

BACKGROUND OF THE INVENTION

1. Field of the Invention

The present invention relates to a sensor used in a disk drive as a magnetic read back sensor and a manufacturing method thereof.

2. Description of the Background Art

Magnetic sensors used in disk drives or tape drives for reading back magnetically recorded information are usually based on thin film structures utilizing a magnetoresistive effect. In particular, recent sensors are based on a spin dependent scattering phenomenon and are generally called giant magnetoresistive (GMR) sensors or spin valve sensors. These sensors depend on having one magnetic layer, called the free layer, in which the direction of magnetization is free to move in response to the magnetic field applied to the sensor. Another layer is called the pinned layer, in which the direction of magnetization is not free to move and is perpendicular to the direction of the magnetization of the free layer when there is no applied external field. In order to achieve maximum sensitivity and linearity, it is required that the magnetization of the free layer in the absence of an applied field to be substantially parallel with the direction of the recorded track. Accordingly it is required that the magnetization in the pinned layer be substantially perpendicular to the recorded track.

Another requirement for the free layer is that there be longitudinal magnetic bias stabilization. Imposing a preferred magnetization direction in the free layer along the axis of the free layer parallel to the medium and perpendicular to the direction of the track insures good linearity and provides robustness to deleterious effects such as Barkhausen noise.

A common method of providing for pinning the pinned layer is to place a layer of antiferromagetic material, AFM, adjacent to the pinned layer. Then, at some point in the manufacture of the head, the structure is heated above the blocking temperature of the AFM, and an external field is placed on the device which is perpendicular to the recorded track direction. The blocking temperature of an AFM material is the temperature above which the material no longer has any exchange coupling strength. The structure is then cooled in the presence of the field. The applied field will orient the pinned layer in the proper direction and as the AFM cools below the blocking temperature exchange coupling will maintain the orientation of the magnetization in the pinned layer. This is the pinning process.

There are at least two possible techniques to provide for longitudinal biasing of the free layer. A common method is to provide two hard magnets, one on each side of the portion of the free layer which defines the track width. This is referred to as hard biasing. During the manufacture of the sensor, the direction of the magnetization in the hard magnet must be set by placing the sensors in a large magnetic field. The hard bias method has some undesirable attributes such as gradual reduction of sensitivity at track edges and is somewhat difficult to control in manufacturing.

Another method of providing for longitudinal biasing of the free layer is to use an AFM layer to deliver exchange coupling similar to that for the pinned layer. The principle difficulty with this approach is that the direction of magnetization in the free layer must be substantially perpendicular to the direction of magnetization in the pinned layer. Thus the steps of heating and subsequent cooling in a field would be appropriate for one of the AFM layers, but not the other. To solve this problem in the past, two different AFM materials have been used which had distinctly different blocking temperatures. The AFM layer with the highest blocking temperature was set first. Then the field angle rotated 90° and the second AFM layer was set at a lower temperature. For reasons of magnetic performance and manufacturability there is generally one optimum AFM material which would serve for both pinned and longitudinal stabilization. However because of the requirement to have AFM materials with different blocking temperatures, the optimum choice of AFM materials was compromised.

SUMMARY OF THE INVENTION

One object of the present invention is to provide a GMR sensor which has an AFM layer for pinning the pinned layer and another AFM layer for longitudinal stabilization of the free layer. Another object is to provide a sensor which can be constructed such that the two AFM layers can have substantially the same blocking temperature. Thus, the sensor can have the two AFM layers made of the same material. Typically there is a limited number of AFM materials which would be optimum choices for both layers based on other considerations such as ease of manufacturing, sensor sensitivity, thermal stability, etc. Another object is to provide a greatly simplified manufacturing process in which the two AFM layers can be set simultaneously during a single sequence of heating and subsequent cooling in a field. Another object is to provide a disk drive having a GMR sensor using two AFM layers.

DETAILED DESCRIPTION OF THE INVENTION

Figure 1:
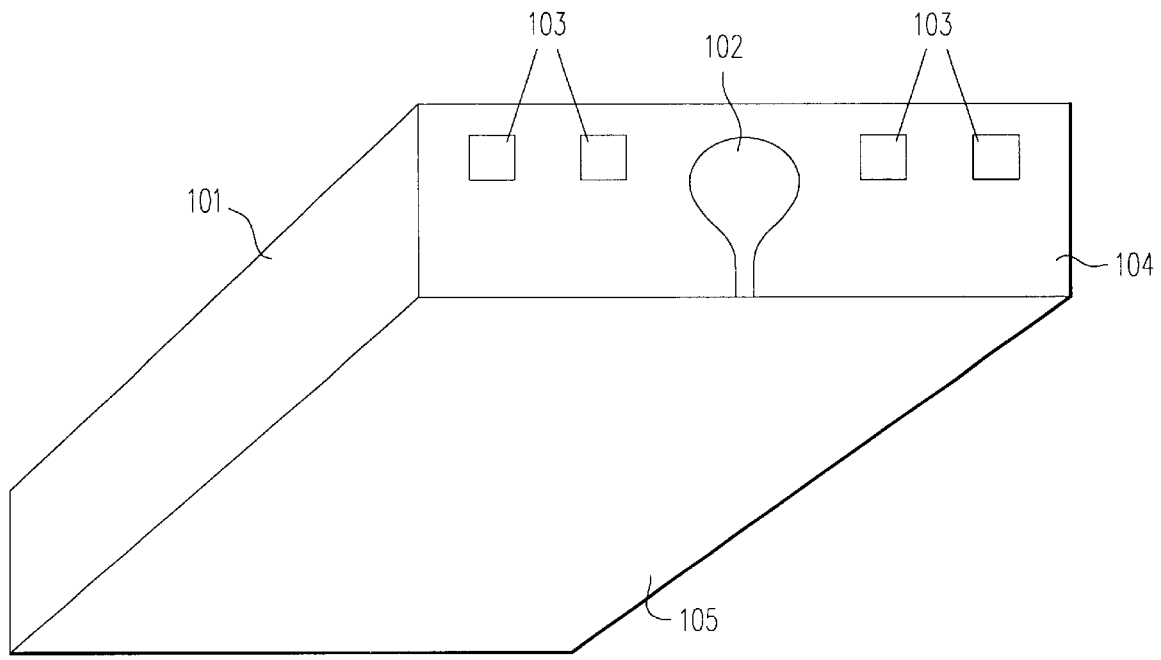
FIG. 1 shows a perspective view of a slider head assembly used in magnetic recording in a disk drive.

In FIG. 1 a diagram of a typical slider and head assembly is shown. The slider 101 is usually made of a rigid ceramic material such as alumina-TiC and is attached to a flexible metal suspension (not shown). A recording head 102 is constructed on the trailing surface 104 of the slider 101. The recording head usually comprises a write element, also known as the write head, and a separate read element, also known as the read head. In addition to the recording head there are metallic pads 103 used to make electrical connections to the recording head. One side 105 of the slider is designed to be in close proximity to a disk and has air bearing features.

Figure 2A:
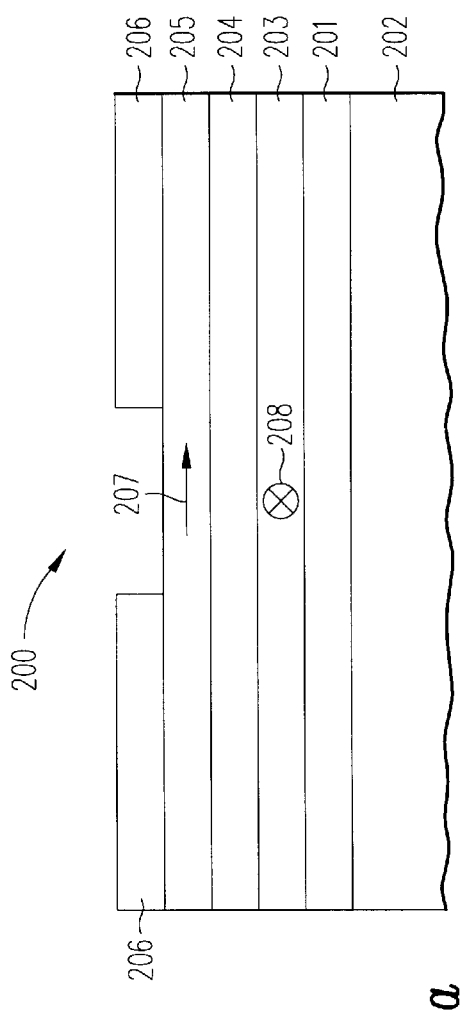
FIG. 2a shows a cross sectional view of the layers in a sensor which has a single pinned layer.

FIG. 2a shows some of the layers of a conventional read element 200 which utilizes the spin-valve (or GMR) effect. A layer which comprises an antiferromagnetic (AFM) material 201 is placed on a substrate layer 202. The substrate layer can be an insulating layer or an adhesion or seed layer. The AFM material can be chosen from a range of materials including but not limited to PtMn, NiMn, IrMn, PdMn, and NiO. A pinned layer 203 is then placed on the AFM layer. A thin nonmagnetic, electrically conductive layer 204, usually copper, is then placed on the pinned layer. A free layer 205 is then placed on the nonmagnetic layer 204. The free layer is usually, but not limited to, a ferromagnetic alloy such as NiFe, CoFe, or CoNiFe. Finally, a pair of stabilization tabs 206 are formed on a surface of the free layer 205. The tabs 206 define the track width and provide longitudinal magnetic stabilization for the free layer. The material in the tabs 206 may be either a hard magnetic material such as an alloy typically comprising cobalt and platinum, or an AFM material such as PtMn which exchange couples with a portion of the free layer. The view of FIG. 2a is that of the sensor as presented to the disk in a disk drive. To achieve a nearly linear response it is desired that the direction of the magnetization 207 in the free layer be substantially parallel to the disk. This is true of all conventional GMR sensors used in magnetic recording. In a GMR sensor it is also desired that the magnetization of the pinned layer be substantially perpendicular to the magnetization of the free layer. Accordingly the magnetization of the pinned layer 208 is shown perpendicular to that of the free layer 207 and also perpendicular to the surface of the disk.

Figure 2B:
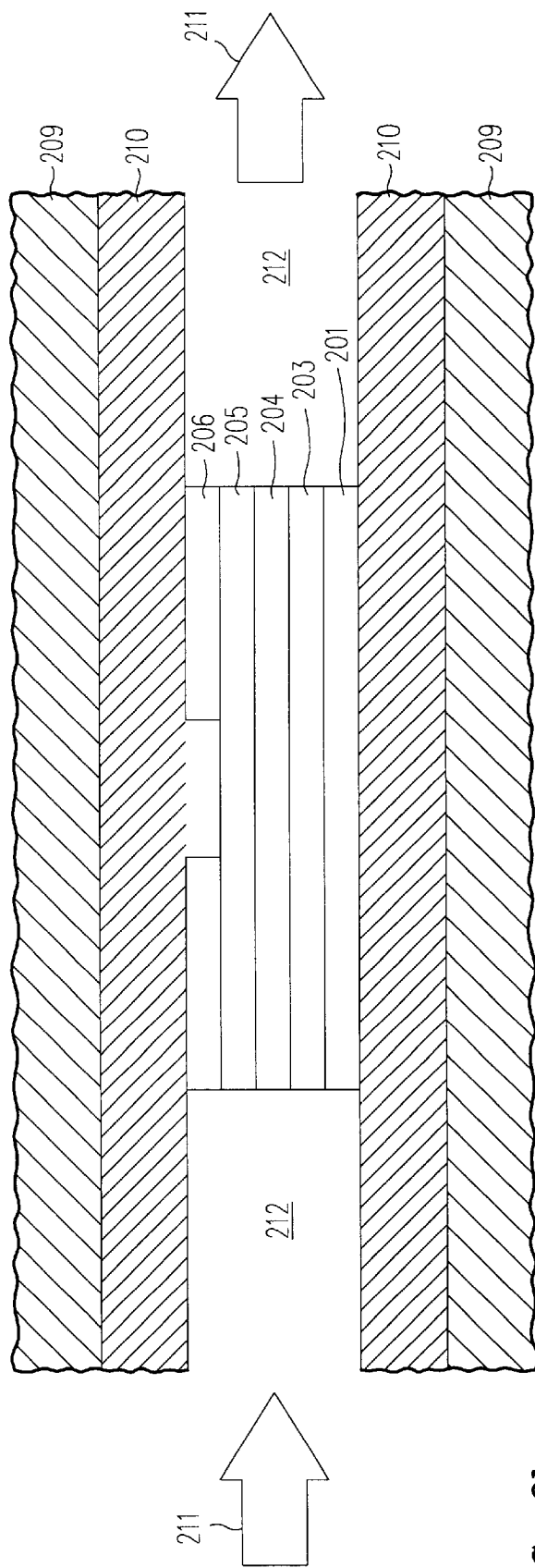
FIG. 2b shows a cross sectional view of the layers in a sensor which has a single pinned layer including views of the bias current direction and the shields.

FIG. 2b shows the stack of sensor layers as positioned between the magnetic shields 209. The purpose of the shields is to restrict the spatial sensitivity of the sensor to a very limited area on the disk. The sensor stack is electrically insulated from the shields by insulating layers 210. In order to extract the electrical signal from the sensor, current 211 is passed through electrical leads 212 through the sensor stack. The direction of the current 211 is parallel to the free layer 205 and is perpendicular to the track direction.

The sensor 200 shown in FIG. 2a has a pinned layer which is comprised of substantially one magnetic layer. This structure is generally called a simple spin valve or simple GMR structure. One difficulty with the simple GMR structure is that there is a noticeable demagnetization field from the pinned layer. This can cause problems with linearity and restricts the choices of magnetic biasing. These problems are greatly reduced by using a composite structure for the pinned layer comprised of two ferromagnetic layers separated by a thin nonmagnetic layer in such a way that the two ferromagnetic layers are antiparallel, AP, coupled. This composite structure is called an AP pinned substructure. The ferromagnetic material is typically an alloy comprising Ni, Fe, and Co. The thin nonmagnetic layer between the two ferromagnetic layers is usually but not limited to ruthenium. A sensor an AP pinned substructure is called an AP pinned GMR sensor, or synthetic AFM GMR sensor.

Figure 3:
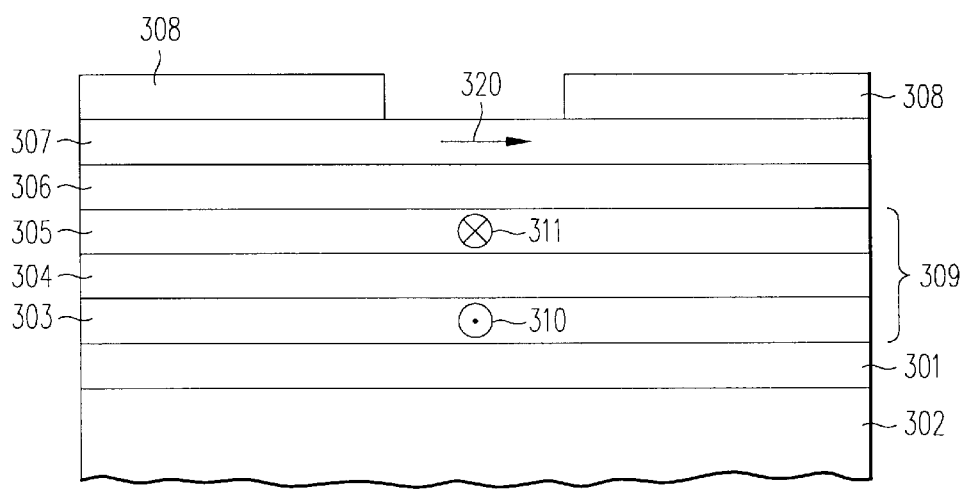
FIG. 3 shows a cross sectional view of the layers in a sensor which has a set of antiparallel layers for the composite pinned layer.

A view of a typical AP pinned GMR structure is shown in FIG. 3. FIG. 3 also illustrates a preferred embodiment wherein the two bias stabilization tabs 308 are constructed of an AFM material exchange coupled with selected portions of the free layer 307. One AFM layer 301 is used for controlling the direction of the first ferromagnetic layer 303 in the AP pinned substructure 309 and a second AFM layer 308 is used for the longitudinal bias of the free layer 307. The AP pinned substructure 309 serves as the pinned layer of the sensor.

In FIG. 3, an AFM layer 301 is placed on the substrate 302. A first ferromagnetic layer 303 is placed on the AFM layer 301. Then a thin nonmagnetic layer 304 is deposited on the first ferromagnetic layer 303. A second ferromagnetic layer 305 is then placed on the thin magnetic layer 304. The composite of layers comprising the first ferromagnetic layer 303, the thin nonmagnetic layer 304 and the second ferromagnetic layer 305 is the AP pinned substructure. The rest of the sensor including the thin nonmagnetic layer 306, the free layer 307, and the bias stabilization tabs 308 serve the same function as in the simple GMR case. Because of the presence of the AP pinned substructure the sensor in FIG. 3 is generally referred to as an AP pinned GMR.

The direction of the magnetization 320 in the free layer 307 in FIG. 3 is parallel to the surface of the disk (not shown). It is desirable that the net magnetization of the AP pinned substructure 309 is substantially perpendicular to the magnetization 320 in the free layer 307. It is possible for the net magnetization of the AP pinned substructure 309 to be zero. In that case the magnetization of each of the ferromagnetic layers 303,305 in the pinned layer 309 should be substantially perpendicular to that of the free layer 307. Thus in FIG. 3 the magnetization 310 of the first ferromagnetic layer 303 in the AP pinned layer 309 is shown perpendicular to that of the free layer 307 and as coming out of the field of view. Because the two ferromagnetic layers 303,305 in the AP pinned substructure have magnetization directions 310,311 which are substantially at 180 degrees with respect to each other (in the absence of an external field), the direction of the magnetization 311 of the second ferromagnetic layer 305 in the AP pinned substructure 309 is also perpendicular to the direction of the magnetization 320 in the free layer 307 but is approximately 180 degrees relative to the direction of magnetization 310 of the first ferromagnetic layer 303. This magnetization 311 is shown going into the field of view in FIG. 3.

During the manufacturing of these structures it is desirable to establish the appropriate directions of the magnetization in the first ferromagnetic layer and the free layer. In a conventional sensor two different AFM materials are chosen so that the blocking temperatures of the two are distinctly different. As an example, if the AFM with the highest blocking temperature is adjacent to the free layer, then the conventional method is to first heat the structure above the blocking temperature of both of the AFM materials. The sensor is then placed in a magnetic field along the direction of the free layer which aligns the magnetization of the free layer in the proper direction. The sensor is then cooled below the blocking temperature of this AFM layer but held above the blocking temperature of the AFM layer adjacent to the pinned layer. While the structure is held at this intermediate temperature the field is rotated 90° relative to the former direction. The assembly is then cooled to ambient temperature. It is critical that an external magnetic field be imposed on the ferromagnetic material as the AFM material cools from a temperature higher than the blocking temperature to a lower temperature. That particular layer is said to be "set" or initialized.

Another advantage of using the present invention for a sensor such as shown in FIG. 3 is that during processing the thickness of the free layer 307 under the exchange tabs 308 is not perfectly uniform. The field strength required for the spin-flop effect is typically in the 1000 to 3000 Oe range. This field strength is higher than customary and is sufficient to overcome demagnetization effects from any nonuniformities in the free layer.

In a typical AP pinned GMR the material for the AFM material can be chosen from a list of AFM materials which include PtMn, NiMn, PdMn, NiO, IrMn and others. These materials must simultaneously meet the demand for good magnetic performance in addition to an acceptable blocking temperature. In general, sensors having AFM layers with higher blocking temperatures are more robust to deleterious heating effects. A conventional sensor requires two different materials with two different blocking temperatures because of the need for initialization. This need compromises both the thermal reliability of the sensor and the magnetic performance because of differences in exchange energy, etc.

The present invention allows the use of the same AFM material to be used for setting both the pinned layer and the bias of the free layer. Thus the material may be chosen for optimal magnetic performance. The key feature in being able to use the same AFM material is to be able to initialize the layers given the same blocking temperature. The initialization process makes use of magnetic behavior generally referred to as a spin flop effect.

Figure 4A:
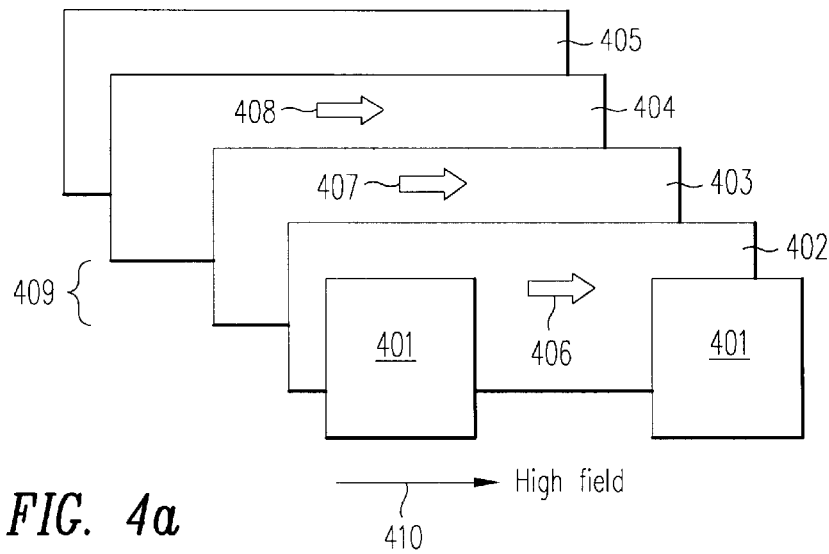
FIG. 4a shows an exploded view of the magnetization directions in the free layer and the two magnetic layers comprising the pinned layer of a sensor while in the presence of a high external magnetic field according to an embodiment of the present invention.
Figure 4B:
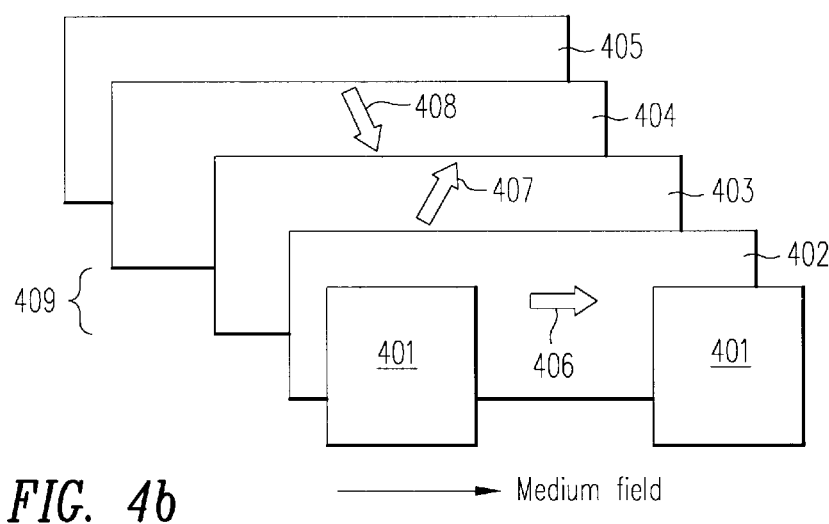
FIG. 4b shows an exploded view, similar to FIG. 4a, of the directions of magnetization in the layers while in the presence of a medium external magnetic field.
Figure 4C:
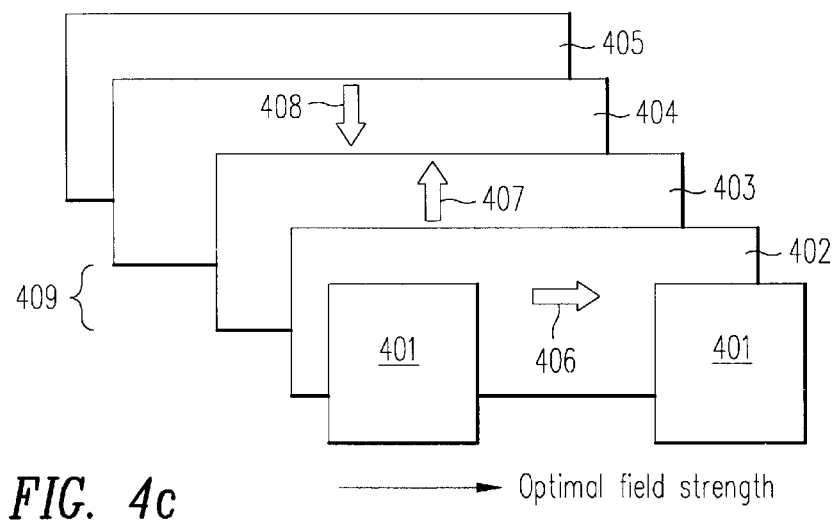
FIG. 4c shows an exploded view, similar to FIGS. 4a and 4b, of the directions of magnetization in the layers while in the optimum field.

The spin flop effect is illustrated in FIGS. 4a–d. In FIG. 4a the important magnetic layers in the sensor are shown including the first AFM exchange layer 401 adjacent to the free layer, the free layer 402, the second ferromagnetic layer 403 of the AP pinned substructure 409, the first ferromagnetic layer 404 of the AP pinned substructure 409, and the AFM material 405 adjacent to the first ferromagnetic layer 404. The AP pinned substructure 409 serves as the pinned layer of the sensor. Also, the magnetization directions are shown. For clarity, the additional layers are not shown. FIG. 4a shows the directions of magnetization when the structure has been placed in a high magnetic field. The magnetization 406 of the free layer aligns with the applied external field for most practical values of the applied field. For high values of the applied field the antiparallel coupling in the AP pinned substructure is broken and the magnetization of both the first ferromagnetic layer 408 and the second ferromagnetic layer 407 align with the applied field. This magnitude of field is not useful for initialization. As the applied field is reduced, the direction of the magnetizations 407,408 in the AP pinned 409 will begin to rotate in order to seek the lowest energy. FIG. 4b shows the case where the magnetizations in the AP pinned substructure have begun to rotate as the magnitude of the applied field is reduced. The magnetizations 407,408 rotate away from the direction of the applied field and in opposite directions from each other. This behavior is referred to as the spin-flop effect. FIG. 4c shows that at some optimum value of the applied field the magnetization of the first ferromagnetic layer 408 will be perpendicular to the applied field and perpendicular to the magnetization of the free layer which is still aligned with the applied field. This is the value of the applied field which is used when cooling both AFM layers 401,405 below the blocking temperature to achieve initialization. At the optimum external field value the direction of the second ferromagnetic layer 407 need not be opposite from the magnetization of the first ferromagnetic layer 408. However when the external field is removed the magnetization of the second ferromagnetic layer 407 will be substantially opposite from that of the first ferromagnetic layer 408. Without using the spin-flop effect to induce the appropriate rotation it is not practical to use the optimal choice of the same material for the two AFM layers because of the difficulty with initialization.

Figure 4D:
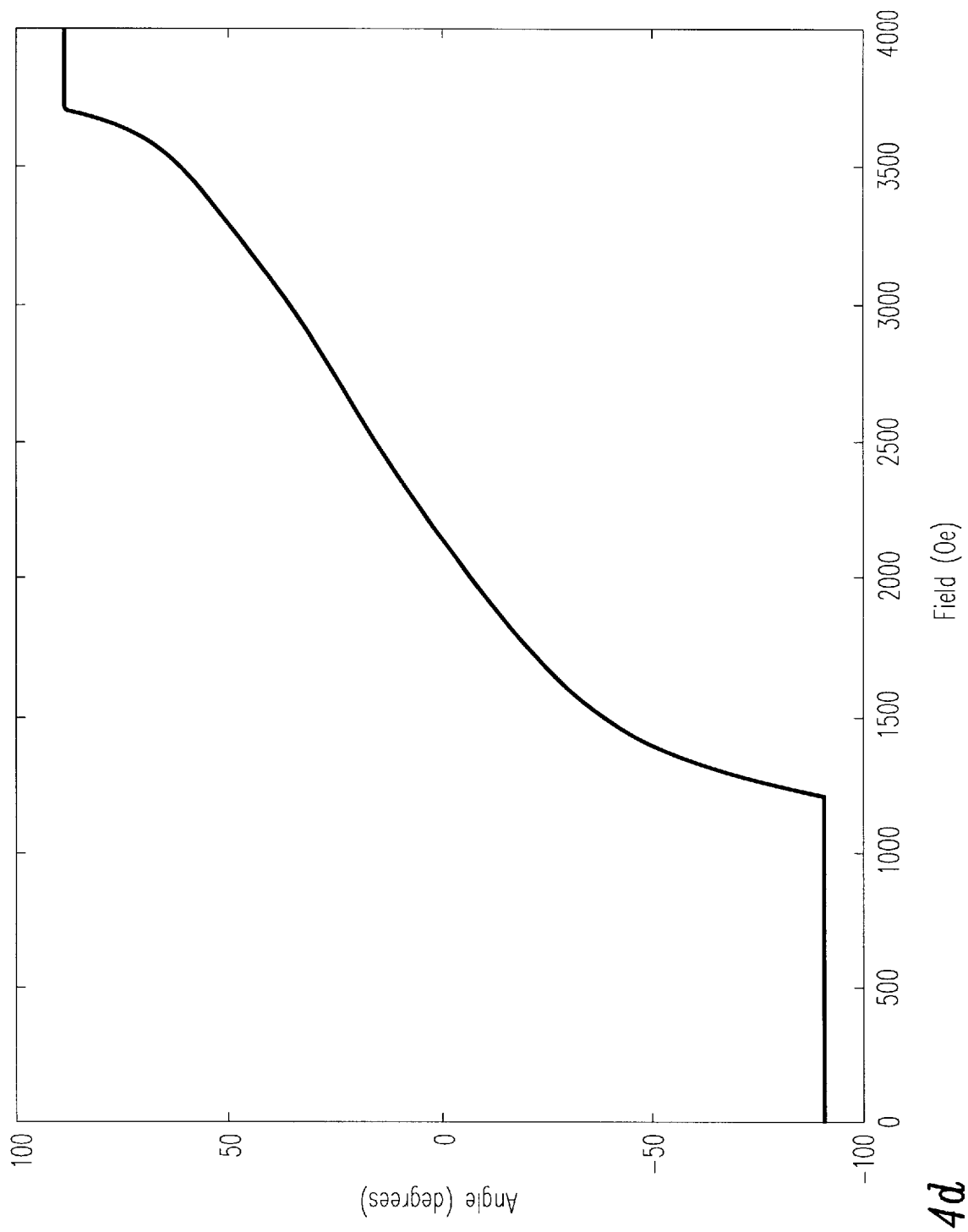
FIG. 4d shows a plot of the angle as a function of external field magnitude for one particular head design.

An example of the angle of the magnetization in the first ferromagnetic layer 408 in the AP pinned substructure 409 as a function of field magnitude is shown in FIG. 4d. In this case the angle is measured from the desired direction of the final angle. The targeted angle is 90° with respect to the field direction. Therefore the desired angle as shown in FIG. 4d is 0°. For this specific case, the coupling strength across the ruthenium layer is 0.5 erg/cm$^2$, and the moments/area of the first and second ferromagnetic layers are 0.2 and 0.4 memu/cm$^2$, respectively. In this case, the optimum field strength to achieve the spin-flop effect is approximately 2200 Oe. Other structures with different materials, thicknesses, and moments would have a different optimal external field strength.

As a practical matter, better process consistency is achieved by first increasing the applied field to a high value and then reducing the magnitude until the optimum value is applied. However it is also possible to place the sensor directly into a field having the optimum value or to raise the field from an initial value of zero. The actual value of the applied field chosen as the optimum depends to some extent on the choice of AFM material, the thickness of the layers, the coupling strength of the nonmagnetic layer, any annealing temperature, and the geometry of the sensor. For these reasons the optimum value is usually determined by first performing a process tolerance study using the specific sensor design.

Figure 5:
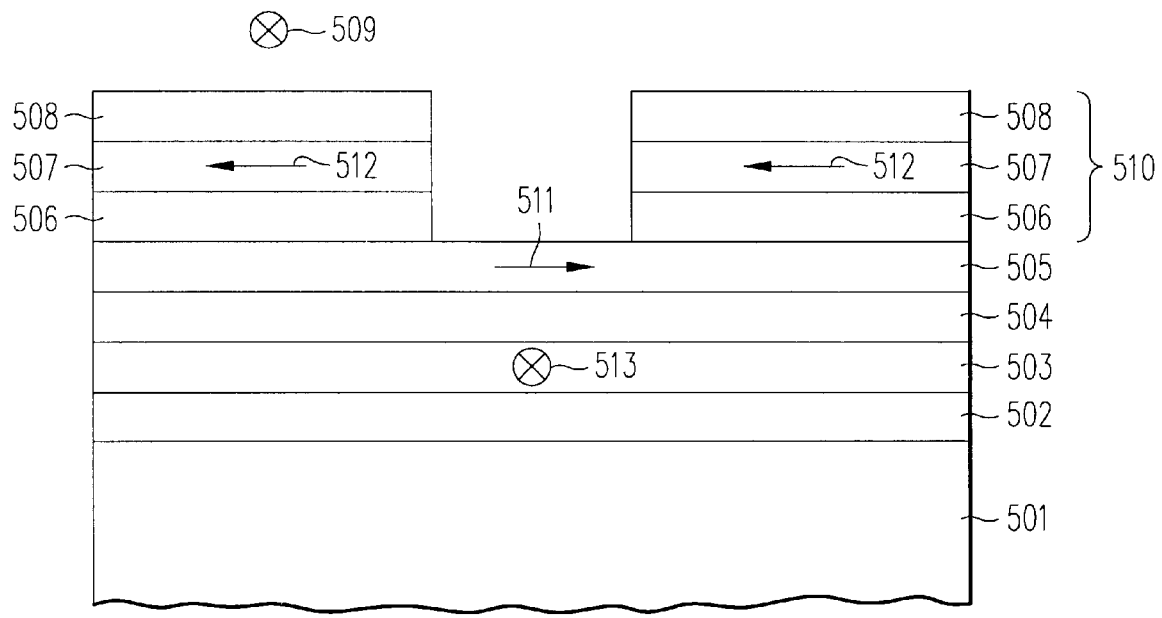
FIG. 5 shows a view of the layers in a sensor which has a set of antiparallel layers for the bias tabs and a simple pinned layer.

An alternate embodiment of this invention is shown in FIG. 5. In this case an AFM layer 502 is placed on the substrate 501. A simple pinned layer 503 is deposited on the AFM layer 502. A thin nonmagnetic layer 504 (e.g. Cu) is placed between the pinned layer 503 and the free layer 505. The biasing tabs 510 for the free layer comprise a thin nonmagnetic layer 506 (e.g. Ru) which allows antiparallel coupling of another ferromagnetic layer 507 with a portion of the free layer. This antiparallel coupling provides the bias stabilization for the free layer. The direction 511 of the magnetization in the free layer 505 is approximately 180° relative to the magnetization 512 in the ferromagnetic layer 507 of the bias tab 510. The ferromagnetic portion 507 of the bias tabs must be pinned and this is provided by an AFM layer 508. The AFM layer 508 can be made of the same material as the AFM layer 502 for the pinned layer and is initialized by the same process step described above.

In the discussion of the spin-flop effect illustrated in FIGS. 4a–d, the direction of the applied external field 410 is shown along the direction of the long axis of the free layer. This is also parallel to the surface of the disk. However, for the structure shown in FIG. 5 the direction of the initialization field 509 should be perpendicular to the desired direction of magnetization 511 of the free layer 505. This direction aligns the magnetization 513 in the pinned layer 503 and permits the spin-flop effect to rotate the magnetization 512 of the ferromagnetic layer 507 of the bias tabs 90° relative to the applied field 509. This must be done at the optimum external field strength.

Figure 6:
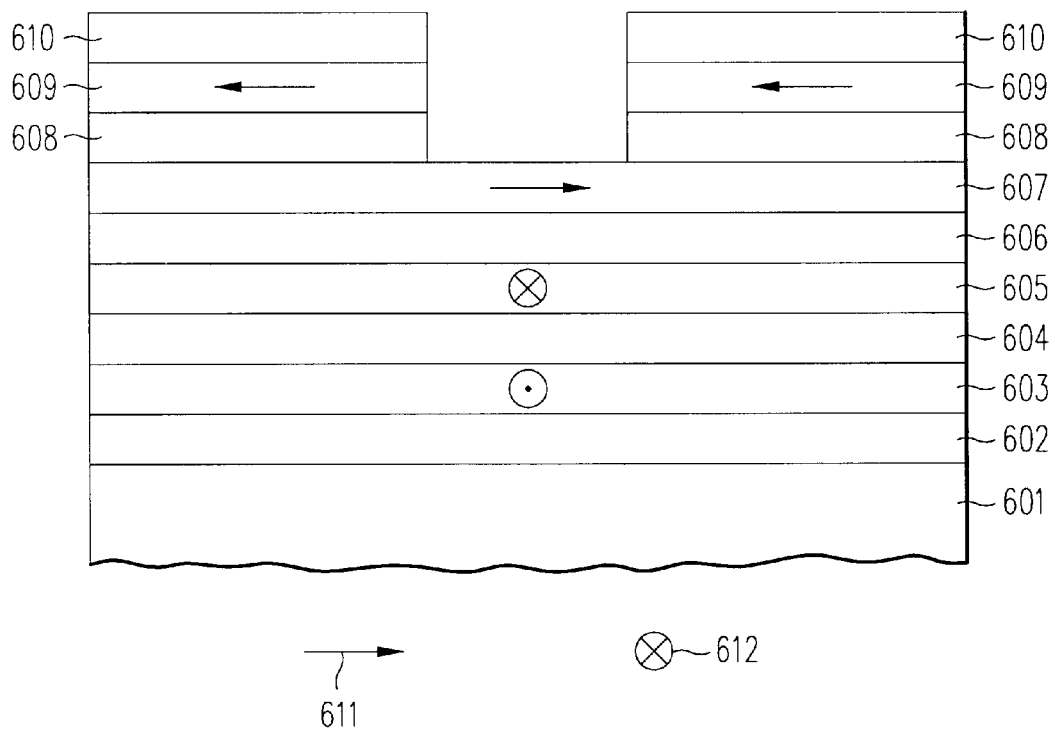
FIG. 6 shows a view of the layers in a sensor which has exchange biased antiparallel coupled layers for both the pinned layer and the bias tabs.

Another alternate embodiment of this invention is shown in FIG. 6. The substrate 601, AFM layer 602, first ferromagnetic layer 603, thin nonmagnetic layer 604, second ferromagnetic layer 605, thin nonmagnetic layer 606, and free layer 607 are as previously described for an AP pinned sensor. The biasing tabs for the free layer comprise a thin nonmagnetic layer 608 which allows antiparallel coupling of another ferromagnetic layer 609. This AP pinned substructure for the bias tabs was previously illustrated in FIG. 5. The structure in FIG. 6 therefore has two groups of layers which are AP pinned: one group 603, 604, and 605 for the pinned layer and another group 607, 608, and 609 for the bias stabilization of the free layer. The ferromagnetic portion 609 of the bias tabs must be pinned and this is provided by an AFM layer 610. The AFM layer 610 can be made of the same material as the AFM layer 602 for the pinned layer and is initialized by the same process step described above. The sensor is cooled below the blocking temperature in the presence of the optimum field to utilize the spin-flop effect.

For the structure in FIG. 6 it is desirable that the spin-flop effect be operative on only one set of the AP pinned substructures. This can be achieved by such means as selecting different thicknesses for the thin nonmagnetic layers 604, 608, or different thicknesses for the ferromagnetic layers 603, 605, 609, or a combination of these. Depending on the choice of layer thicknesses it is possible to have the direction of the initialization field either along the sensor direction 611 (using the spin-flop effect on the pinned layer) or perpendicular to the disk direction 612 (using the spin-flop effect on the bias stabilization tabs). It is also possible to use an applied field direction which is not at 90° but has a magnitude which would result in the appropriate angle (see FIG. 4d). This magnitude and direction could be chosen to accommodate both AP pinned substructures in FIG. 6a. The important feature is that a simple initialization step is required with only one externally applied field and one cooling step in the presence of this field.

Figure 7:
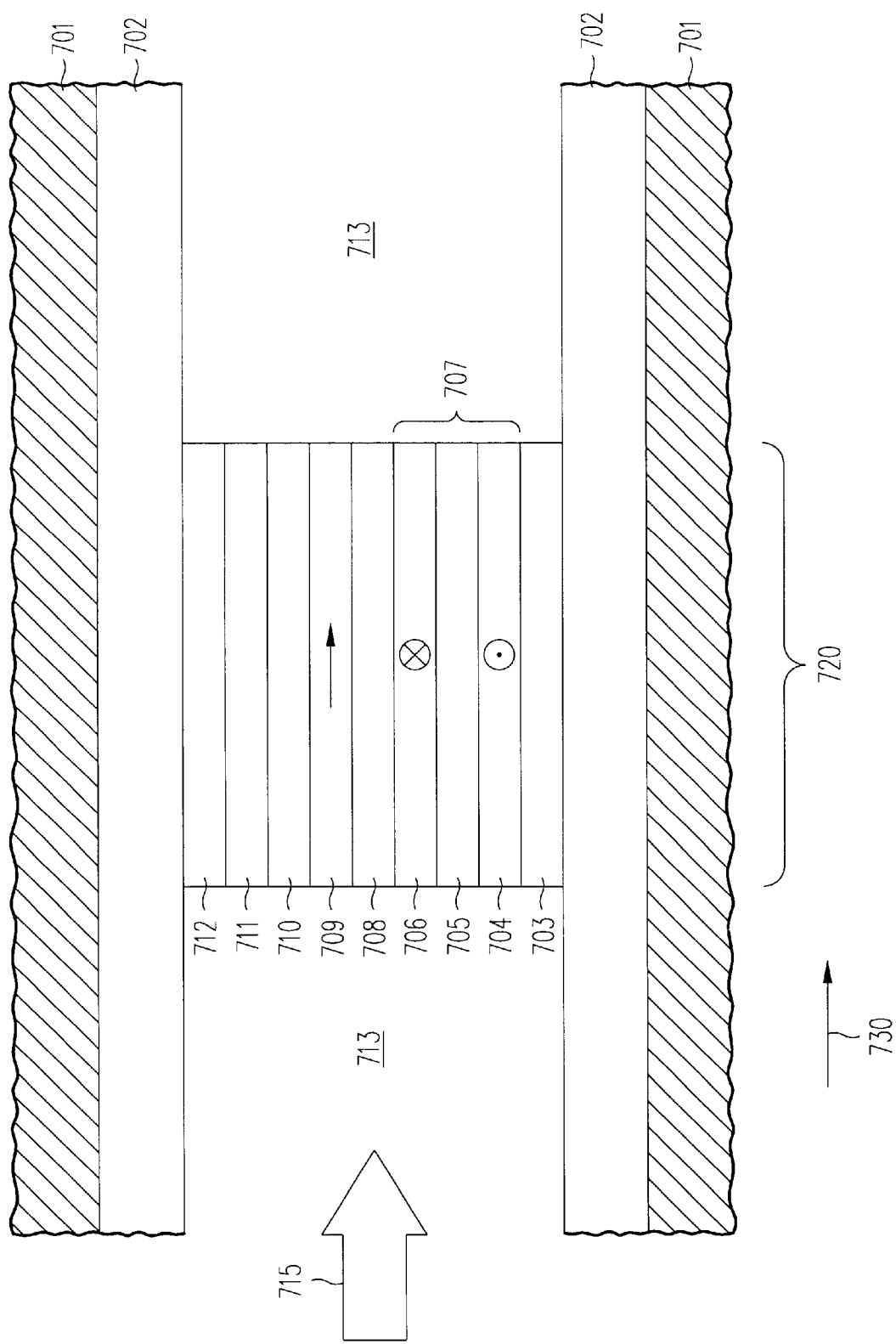
FIG. 7 shows a GMR sensor wherein the width of the layers in the sensor approximately defines the magnetic trackwidth.

Another embodiment is shown in FIG. 7. The sensor shown in FIG. 7 differs from the sensors shown in the prior Figures in that the physical width 720 of the layers approximately defines the magnetic trackwidth of the sensor. A first AFM layer 703 provides exchange coupling with the first ferromagnetic layer 704 of the AP pinned substructure 707. The nonmagnetic layer 705 and a second ferromagnetic layer 706 complete the AP pinned substructure 707 which serves as the pinned layer of the sensor. A nonmagnetic layer 708 usually of copper separates the second ferromagnetic layer 706 of the AP pinned substructure 707 from the free layer 709. A third ferromagnetic layer 711 is separated from the free layer 709 by third nonmagnetic layer 710. The third nonmagnetic layer may be formed from a number of materials such as Ru or Ta. Ru or Ta is preferred over Cu for layer 710 to minimize possible GMR behavior of the free layer 709, nonmagnetic layer 710, ferromagnetic layer 711 combination. A second AFM layer 712 is exchanged coupled with the third ferromagnetic layer 711. The stack of layers forming the sensor is connected to electrical leads 713 and is insulated with an insulating material 702 from the magnetic shields 701. The direction of the sense current 715 is indicated. Also the direction 730 of the external field required to take advantage of the spin-flop effect in indicated. One novel feature of the sensor in FIG. 7 is that bias stabilization of the free layer is accomplished by weakly coupling the third ferromagnetic layer 711 through the third nonmagnetic layer 710. Additionally the width of the third ferromagnetic layer is approximately the width of the free layer. The width 720 of all the layers in FIG. 7 are shown to be equal. In practice some variation of widths will occur because of processing artifacts.

The process of using the spin-flop effect to achieve a simplified initialization process allows sensors having the same material for the AFM layers to be practical. However initialization using the spin-flop effect could also be used on sensors having two different AFM materials. The only requirement is that the blocking temperature of both AFM layers must be initially exceeded and that the final temperature after the cooling step in the presence of the external field be below the blocking temperature of both materials.

For the purposes of this invention it is immaterial whether the magnetization of the free layer (e.g. 309 in FIG. 3) is pointing left or right. It is also immaterial whether the magnetization (310 in FIG. 3) of the first ferromagnetic layer (303 in FIG. 3) is into or out of the field of view. It is also immaterial if during the construction of the sensor, the pinned layer is deposited first and then the free layer is deposited or whether the order of layers is reversed. However, it is important that the magnetizations of the two ferromagnetic layers (e.g. 310, 311 in FIG. 3) be substantially opposite to each other after the removal of the external field.

Figure 8A:
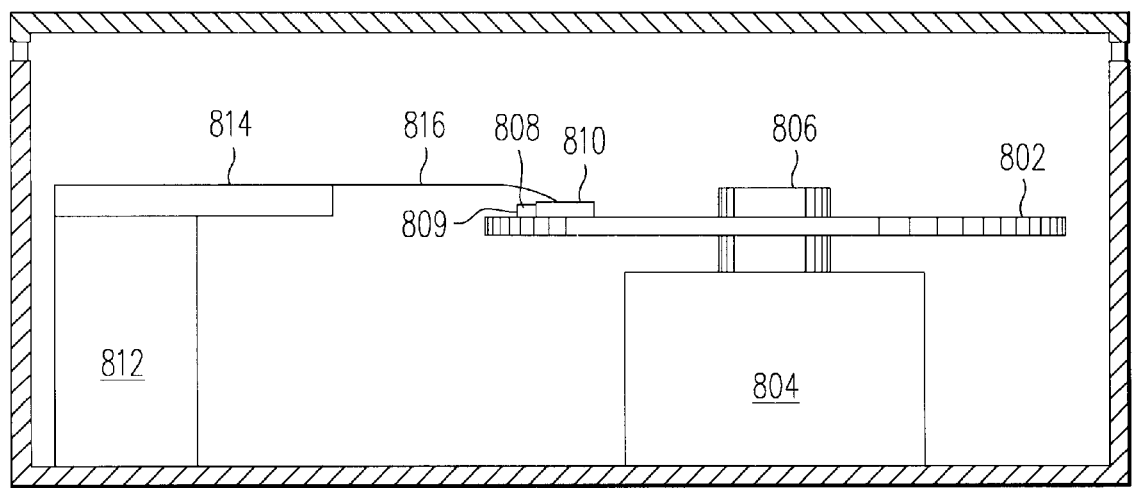
FIG. 8a shows a cross section view of a recording device using the invented sensor.
Figure 8B:
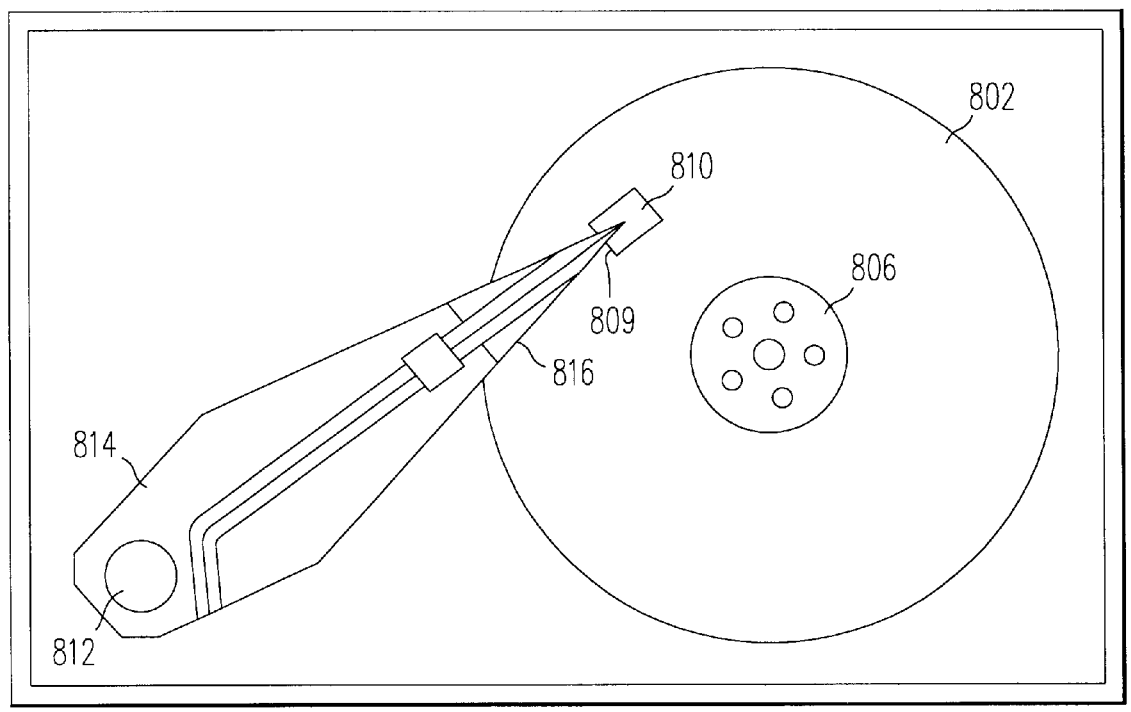
FIG. 8b shows a top view of a recording device using the invented sensor.

FIGS. 8a and 8b show the present invention as used in a magnetic recording disk drive. The magnetic recording disk 802 is rotated by drive motor 804 with hub 806, which is attached to the drive motor. The disk comprises a substrate, a magnetic layer, an optional overcoat layer such as carbon, and typically a lubricant layer such as a perfluoropolyether. The substrate is typically either aluminum, glass, or plastic. Some disk drives are designed such that the slider 810 comes to rest on the disk when the disk drive is stopped. In other disk drives, the slider is lifted off of the disk surface when the disk drive is turned off. The latter is preferable when the surfaces of the slider and the disk are designed to have very low roughness. This is advantageous for designs requiring frequent or continuous contact between the slider and the disk during normal operation.

A recording head assembly 808 is formed on the trailing surface of a slider 810. The slider has a trailing vertical surface 809. The recording head assembly usually comprises a separate write element along with the GMR read sensor. The slider 810 is connected to the actuator 812 by means of a rigid arm 814 and a suspension 816. The suspension 816 provides a force which pushes the slider toward the surface of the recording disk 802.

While the invention has been described above in connection with preferred embodiments thereof and as illustrated by the drawings, those with skill in the art will readily recognize alternative embodiments of the invention can be easily produced which do not depart from the spirit and scope of the invention as defined in the following claims.

I claim:

1. A spin valve magnetic sensor, comprising:
    a pinned layer comprising an AP pinned substructure layer, a first ferromagnetic layer, a first nonmagnetic layer, and a second ferromagnetic layer, said first ferromagnetic layer being antiparallel coupled to said second ferromagnetic layer;
    a first antiferromagnetic layer exchange coupled to said first ferromagnetic layer of said AP pinned substructure;

a free layer separated from said pinned layer by a second nonmagnetic layer; and, a second antiferromagnetic layer covering a portion of said free layer and exchange coupled with said portion of said free layer providing magnetic bias stabilization of said free layer, wherein said first and second anti ferromagnetic layers are made of the same material having substantially the same composition and having substantially the same blocking temperature, and said first and second ferromagnetic layers are initialized in a single sequence of heating and subsequent cooling in a magnetic field, wherein said magnetic field is varied from a start value to an optimum value during the single sequence of heating and cooling in said magnetic field.

2. A spin valve magnetic sensor having an air bearing surface (ABS), comprising:

a pinned layer comprising an AP pinned substructure, said AP pinned substructure comprising a first ferromagnetic layer, a first nonmagnetic layer, and a second ferromagnetic layer, said first ferromagnetic layer being antiparallel coupled to said second ferromagnetic layer; a first antiferromagnetic layer exchange coupled to said first ferromagnetic layer of said AP pinned substructure;

a free layer separated from said pinned layer by a second nonmagnetic layer; and, a first and second bias tab affixed to said free layer and covering a portion thereof, each said bias tab comprising a third ferromagnetic layer, a third nonmagnetic layer separating said third ferromagnetic layer from said free layer, and a second antiferromagnetic layer exchange coupled to said third ferromagnetic layer, wherein said first and second antiferromagnetic layers are made of the same material having substantially the same composition and having substantially the same blocking temperature, and said first and second ferromagnetic layers are initialized in a single sequence of heating and subsequent cooling in a magnetic field, wherein a direction and magnitude of said magnetic field is selected for initializing both said first and said second antiferromagnetic layers in said single sequence, wherein said magnetic field is not oriented in a direction parallel to said ABS.

3. A spin valve magnetic sensor having an air bearing surface (ABS), comprising:

a pinned ferromagnetic layer;

a first antiferromagnetic layer exchange coupled to said pinned layer;

a free layer separated from said pinned layer by a first nonmagnetic layer; and, bias tabs affixed to said free layer and covering a portion thereof, said bias tabs comprising a second ferromagnetic layer separated from said free layer by a second nonmagnetic layer, and a second antiferromagnetic layer exchange coupled to said second ferromagnetic layer, wherein said first and second antiferromagnetic layers are made of the same material having substantially the same composition and having substantially the same blocking temperature, and said first and second ferromagnetic layers are initialized in a single sequence of heating and subsequent cooling in a magnetic field, wherein a direction and magnitude of said magnetic field is selected for initializing both said first and said second antiferromagnetic layers in said single sequence, wherein said magnetic field is not oriented in a direction parallel to said ABS.

4. A spin valve magnetic sensor having an air bearing surface (ABS) comprising:

a first anti ferromagnetic layer;

a pinned layer comprising an AP pinned substructure, said ALP pinned substructure comprising a first ferromagnetic layer, a first nonmagnetic layer, and a second ferromagnetic layer, said first ferromagnetic layer being antiparallel coupled to said second ferromagnetic layer;

a second nonmagnetic layer formed on the pinned layer;

a free layer formed on the second nonmagnetic layer;

a third nonmagnetic layer formed on the free layer;

a third ferromagnetic layer formed on the third nonmagnetic free layer;

a second antiferromagnetic layer exchange coupled with said ferromagnetic layer; and, wherein said first, second, third ferromagnetic, first, second, third nonmagnetic, first, second anti ferromagnetic, and free layers have substantially the same width, and, wherein the first and second anti ferromagnetic layers are formed from substantially the same material having substantially the same blocking temperature, and said first and second ferromagnetic layers are initialized in a single sequence of heating and subsequent cooling in a magnetic field, wherein a direction and magnitude of said magnetic field is selected for initializing both said first and said second antiferromagnetic layers in said single sequence, wherein said magnetic field is not oriented in a direction parallel to said ABS.

5. A magnetic storage system, comprising:

a magnetic storage medium for the recording of data;

a motor connected with said magnetic storage medium;

a slider having a magnetic recording head assembly maintained in close proximity to the storage medium during relative motion between said head assembly and said storage medium, said recording head assembly having a spin valve sensor comprising, a pinned layer comprising an AP pinned substructure, said AP pinned substructure comprising a first ferromagnetic layer, a first nonmagnetic layer, and a second ferromagnetic layer, said first ferromagnetic layer being antiparallel coupled to said second ferromagnetic layer;

a first antiferromagnetic layer exchange coupled to said first ferromagnetic layer;

a free layer separated from said pinned layer by a second nonmagnetic layer;

a second anti ferromagnetic layer covering a portion of said free layer and exchange coupled with said portion of said free layer providing magnetic bias stabilization of said free layer, wherein said first and second anti ferromagnetic layers are made of the same material having substantially the same composition and having substantially the same blocking temperature, and said first and second ferromagnetic layers are initialized in a single sequence of heating and subsequent cooling in a magnetic field, wherein said magnetic field is varied from a start value to an optimum value during the single sequence of heating and cooling in said magnetic field; and, a suspension connected to the slider which positions said slider for magnetic recording on the magnetic storage medium.

6. A magnetic storage system, comprising:

a magnetic storage medium for the recording of data;

a motor connected to said magnetic storage medium;

a slider having a magnetic recording head assembly maintained in close proximity to the storage medium during relative motion between said head assembly and said storage medium, said recording head assembly having an air bearing surface (ABS) and a spin valve sensor comprising,
- a pinned layer,
- a first anti ferromagnetic layer exchange coupled to said pinned layer,
- a free layer separated from said pinned layer by a first nonmagnetic layer,
- bias tabs covering a portion of said free layer, said bias tabs comprising a second nonmagnetic layer separating said free layer from a ferromagnetic layer and a second antiferromagnetic layer exchange coupled with said ferromagnetic layer providing magnetic bias stabilization of said free layer,
- wherein said first and second anti ferromagnetic layers are made of the same material having substantially same composition and having substantially the same blocking temperature, and said first and second ferromagnetic layers are initialized in a single sequence of heating and subsequent cooling in a magnetic field, wherein a direction and magnitude of said magnetic field is selected for initializing both said first and said second antiferromagnetic layers in said single sequence, wherein said magnetic field is not oriented in a direction parallel to said ABS; and, a suspension connected to the slider which positions said slider for magnetic recording on the magnetic storage medium.

* * * * *